(12) United States Patent
Chen et al.

(10) Patent No.: US 10,325,796 B2
(45) Date of Patent: Jun. 18, 2019

(54) APPARATUS AND SYSTEM FOR DETECTING WAFER DAMAGE

(71) Applicant: Taiwan Semiconductor Manufacturing Co., Ltd., Hsin-Chu (TW)

(72) Inventors: Yi-Feng Chen, Hsin-Chu (TW); Yan Cing Lin, Hsinchu (TW); Chui-Ya Peng, Hsin-Chu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/797,466

(22) Filed: Oct. 30, 2017

(65) Prior Publication Data

US 2019/0131157 A1 May 2, 2019

(51) Int. Cl.
*H01L 21/677* (2006.01)
*H01L 21/687* (2006.01)
*G01B 5/30* (2006.01)
*H01L 21/66* (2006.01)
*H01L 21/67* (2006.01)

(52) U.S. Cl.
CPC .......... *H01L 21/67766* (2013.01); *G01B 5/30* (2013.01); *H01L 21/67288* (2013.01); *H01L 21/68707* (2013.01); *H01L 22/12* (2013.01)

(58) Field of Classification Search
CPC ......... H01L 21/67766; H01L 21/67288; H01L 21/68707; H01L 22/12; H01L 21/67259; H01L 21/681; H01L 21/6838; H01L 21/68778; G01B 5/30; G03F 7/70783; B25J 11/0095; B25J 15/0616
See application file for complete search history.

(56) References Cited

U.S. PATENT DOCUMENTS

| | | | |
|---|---|---|---|
| 4,513,430 A | 4/1985 | Vora et al. | |
| 6,476,604 B1* | 11/2002 | Kong | G01N 22/00 257/E21.53 |
| 2002/0114684 A1* | 8/2002 | Jeong | H01L 21/67259 414/217.1 |
| 2010/0285614 A1* | 11/2010 | Wilby | G01G 9/00 438/14 |
| 2011/0298454 A1* | 12/2011 | Ausserlechner | G01R 15/207 324/252 |
| 2013/0252189 A1* | 9/2013 | Lin | H01L 21/68735 432/1 |
| 2018/0088549 A1* | 3/2018 | Strahle | A47L 15/006 |
| 2018/0100893 A1* | 4/2018 | Baer | G01R 31/2893 |

* cited by examiner

*Primary Examiner* — Shahed Ahmed
(74) *Attorney, Agent, or Firm* — Duane Morris LLP (57) ABSTRACT

An apparatus includes a holder configured to carry one or more semiconductor wafers, an arm coupled with the holder, and a detector coupled with either the holder or the arm. The detector is configured to measure a change in weight of the one or more semiconductor wafers. The detector includes a strain gauge weight sensor, a piezoelectric sensor, or any other suitable sensor. The change in weight of the one or more semiconductor wafers is used to determine any possible presence of a broken or missing wafer.

20 Claims, 8 Drawing Sheets

APPARATUS AND SYSTEM FOR DETECTING WAFER DAMAGE

BACKGROUND

In the manufacture of integrated circuits and semiconductor devices, semiconductor substrates such as wafers are moved through many processing operations or steps by using wafer transfer robots. These processing operations may also include washing and cleaning. To achieve high throughput, multiple robots may be used in a continuous in-line process. Semiconductor wafers are stored in wafer cassettes for convenience in handling the wafers in groups. Broken or missing wafers may cause further damages to other wafers in a same cassette or different cassettes. It is highly desirable that the robots are capable of handling the semiconductor wafers accurately, reliably and without damaging the surface of the wafer, and a missing or broken wafer should be detected in time to prevent further damage to other wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. Thus, for example, a reference to "a semiconductor structure" is a reference to one or more of such structures and equivalents thereof known to those skilled in the art, and so forth. When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive; as another example, the phrase "about 8%" preferably (but not always) refers to a value of 7.2% to 8.8%, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

Figure 1:
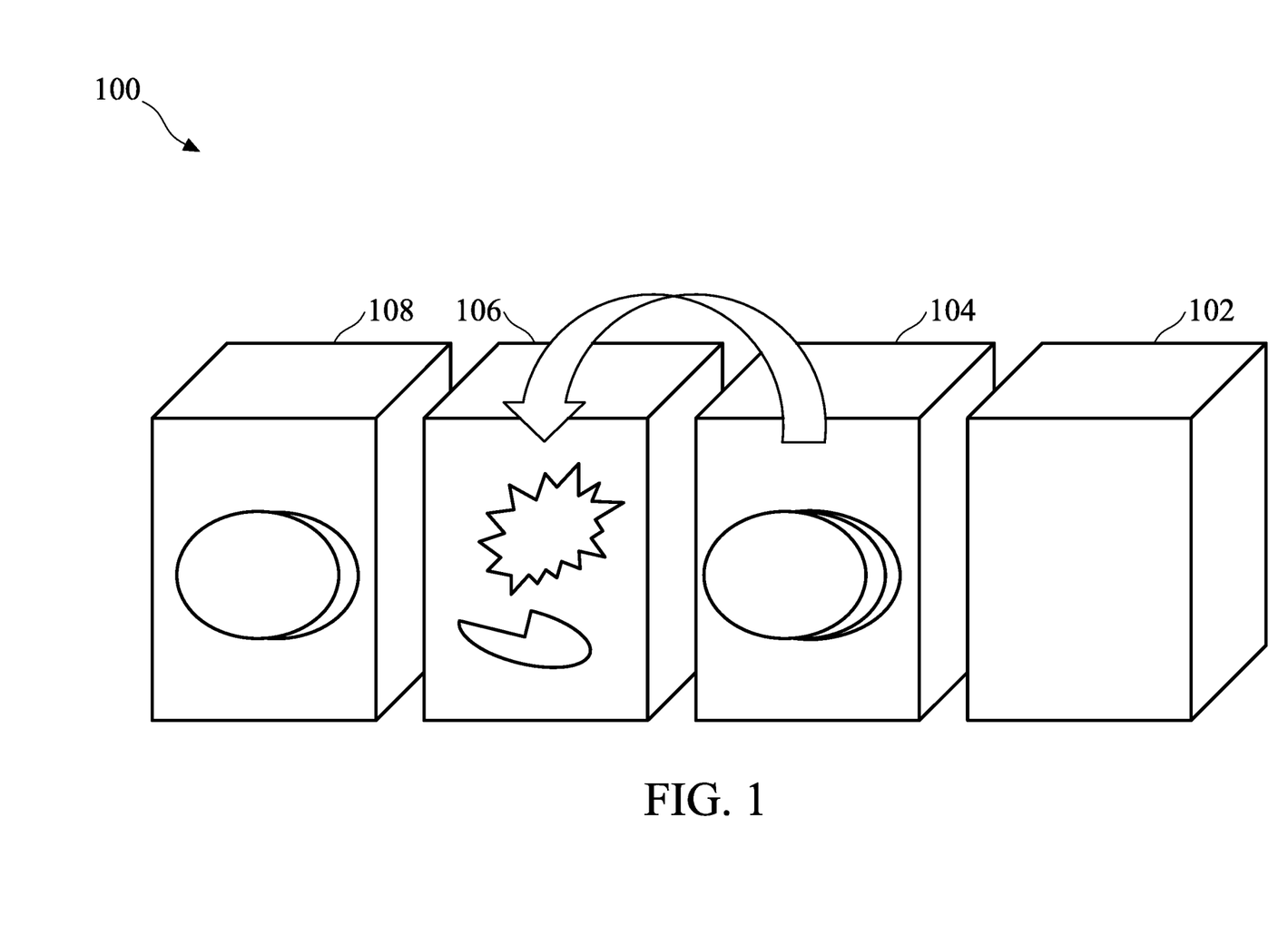
FIG. 1 is a prospective view illustrating a process in which semiconductor wafers are dipped or immersed into liquids in multiple tanks sequentially in some embodiments.

Referring to FIG. 1, wafers are dipped or immersed into liquids in different tanks 102, 104, 106 and 108 for the purpose of chemical treatment, etching, washing and cleaning. Multiple wafers are placed by one batch in a carrier (or cassette), which is controlled by a robot. To achieve high throughput, multiple robots may be used in a continuous in-line process, and each batch of wafers goes through different tanks sequentially. The liquids may be deionized water, organic solvents, acids, bases, or any other chemicals. For example, as shown in FIG. 1, tanks 102, 104, 106 and 108 may contain acids, deionized water, acids, and deionized water, respectively. The liquids may be heated to a high temperature depending on process types.

Regardless of the care taken in handling wafers, occasionally one or more wafers may be damaged, broken, or missing from the carrier. When such conditions occur, broken wafer and debris may fall into a tank. The broken wafer and debris may cause further damages to other wafers, and may cause a robot or carrier to collide with other robots and carriers if a robot or carrier has to stop suddenly or is stuck in one tank. Such a collision may damage more wafers and even the tanks, which may be made of a ceramic such as quartz. To prevent further damages, it is necessary to quickly stop the in-line operation to remove the broken wafer. Operation of the processing system with a missing or broken wafer not only creates the risk of damage to the machine or to other wafers but also wastes valuable machine time. Therefore, an apparatus is needed for detecting a damaged, broken or missing wafer as soon as such a condition occurs.

At least three different methods have been used in different embodiments. Based on the working principles, these methods include those using light reflectance, optical scanning, and photo analysis. In the method using light reflectance, an infra-red (IR) light is used to detect whether a carrier is loaded with at least one wafer. But the number of the wafer cannot be detected using such a method. In the method using optical scanning, a charge coupled device (CCD) is used to scan and detect the number of wafers. However, the CCD is installed outside a tank only because of spatial limitation and interference of liquid and vapor in the tanks. In the method of photo analysis, many photos are taken and then analyzed to provide shapes and numbers of the wafers. Vapors and waves of the liquids in the tanks can affect photo quality, and then provide inaccurate detection.

The present disclosure provides an apparatus and a method of using such an apparatus for determining any possible presence of a wafer that is broken, damaged, or missing from a wafer holder. The apparatus comprises a detector configured to measure load or force of a system including the wafer holder, determine a change in wafer weight, and provide other useful data such as processing location and number of wafers. These data are used to quickly detect breakage, damage and loss of wafer. An alarm is given immediately after such a condition occurs. Wafer pieces in the tank may thus be promptly retrieved, thereby mitigating further risks.

In FIGS. 2-5, like items are indicated by like reference numerals, and for brevity, descriptions of the structure, provided above with reference to the preceding figures, are not repeated.

Figure 2:
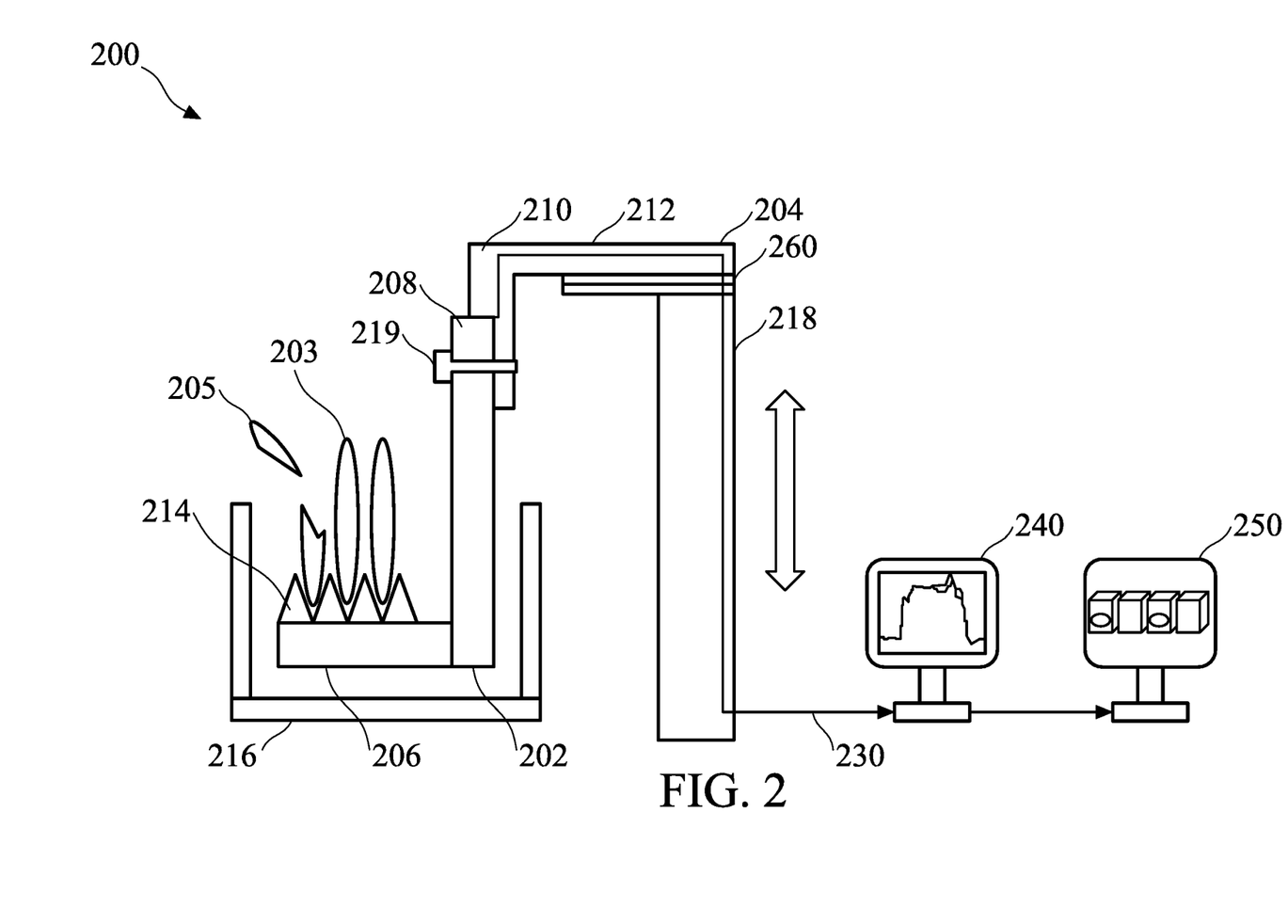
FIG. 2 is a cross-sectional view of an exemplary apparatus comprising a detector coupled with a holder or an arm in accordance with some embodiments.

Referring to FIG. 2, an exemplary apparatus 200 in accordance with some embodiments is illustrated. Exemplary apparatus 200 comprises a holder 202 configured to carry one or more semiconductor wafers 203, an arm 204 coupled with the holder 202, and a detector 220 or a detector unit 119 comprising a detector 220 (FIG. 3), which is coupled with either the holder 202 or the arm 204. The detector 220 is configured to measure the load to the holder 202, thus a change in weight of the one or more semiconductor wafers 203. Unless expressly indicated otherwise, references to the term "coupled to" a part made herein will be understood to encompass both direct connection to and in indirect connection to (or adjacent to) the part through one or more intermediate parts. In some embodiments, the detector 220 is directly connected or attached to either the holder 202 or the arm 204, or both. In some other embodiments, the detector unit 119 comprising a detector 120 (FIG. 3) is connected or attached to either the holder 202 or the arm 204, or both.

In some embodiments, the holder 202 may be a L-shaped lifter, which comprises a horizontal portion 206 and a vertical portion 208. The horizontal portion 206 is configured to carry the one or more semiconductor wafers 203. The horizontal portion 206 may be in a rectangular, square or circular shape in the horizontal plane. The vertical portion 208 is configured to be coupled with the arm 204. The holder 202 comprises or is made of a material resistant to heat and chemicals, for examples, acids and bases. Examples of a suitable material for the holder 202 include, but are not limited to, quartz, alumina, sapphire, graphite, fused silica, glass, and a combination thereof. In some embodiments, the holder 202 is made of quartz.

In some embodiments, the arm 204 is L-shaped comprising a vertical portion 210 and a horizontal portion 212. The vertical portion 210 is configured to be coupled with the vertical portion 208 of the holder 202. Both the vertical portion 208 and the vertical portion 210 may be an elongated beam having a cross-section in a rectangular or circular shape, or other shape. The arm 204 comprises or is made of metal (e.g., steel) coated with a protective coating comprising a polymer or ceramic in some embodiments. The protective coating is resistant to chemical such as acids and bases.

In the exemplary apparatus 200, shelves or dividers 214 may be disposed above and coupled with the horizontal portion 206 of the holder 202 in some embodiments. The shelves or dividers 214 are configured to hold and fix semiconductor wafers 203, which can be exposed to liquids when the holder 202 is dipped and immersed into liquid inside a tank 216. In some embodiments, the holder 202 is so configured that a damaged or broken piece 205 of wafers 203 falls into the liquid in the tank 216.

The exemplary apparatus 200 may further comprise a robot beam 218 connected with the arm 204 in some embodiments. The robot beam 218 is movable vertically and/or horizontally, and may rotate to move the arm 204 and the holder 202. The robot beam 218 may be connected with an energy source and may be driven electrically in some embodiments. Through the connection of the arm 204, the robot beam 218 is configured to move the holder 202 vertically and/or horizontally. The exemplary apparatus 200 comprising the holder 202, the arm 204, and the robot beam 218, is a wafer transferring apparatus. When the holder 202 is moved vertically down or up, the wafers 203 are dipped into or moved out of a liquid in a tank 216. When the holder 202 is moved horizontally, the wafers 203 may be moved from one tank to another tank.

The exemplary apparatus 200 further comprises at least a pair of wires 230 connected with the detector 220 or the detector unit 119 comprising the detector 220. The wires 230 are configured to provide signals for measuring the load or force, and thus the change in weight of the one or more semiconductor wafers 203.

In some embodiments, the exemplary apparatus 200 further comprises a data analyzer 240, which are connected with the detector 220 through the wires 230. The data analyzer 240 is configured to analyze signals from the detector 220 to provide the change in weight of the one or more semiconductor wafers 203. The analyzer 240 may further provide an alarm if a wafer 203 is broken, damaged, or missing. The exemplary apparatus 200 may further comprise a second analyzer 250 to display a diagram including different processing tanks 216 and the location of wafers 203 in different processing steps. The second analyzer 250 is configured to show the exact location of a wafer 203 that is broken, damaged, or missing. Both the data analyzer 240 and the second analyzer 250 may be a computer or a computing module with a display screen. A product line tool software is installed in both the data analyzer 240 or the second analyzer 250.

Figure 3:
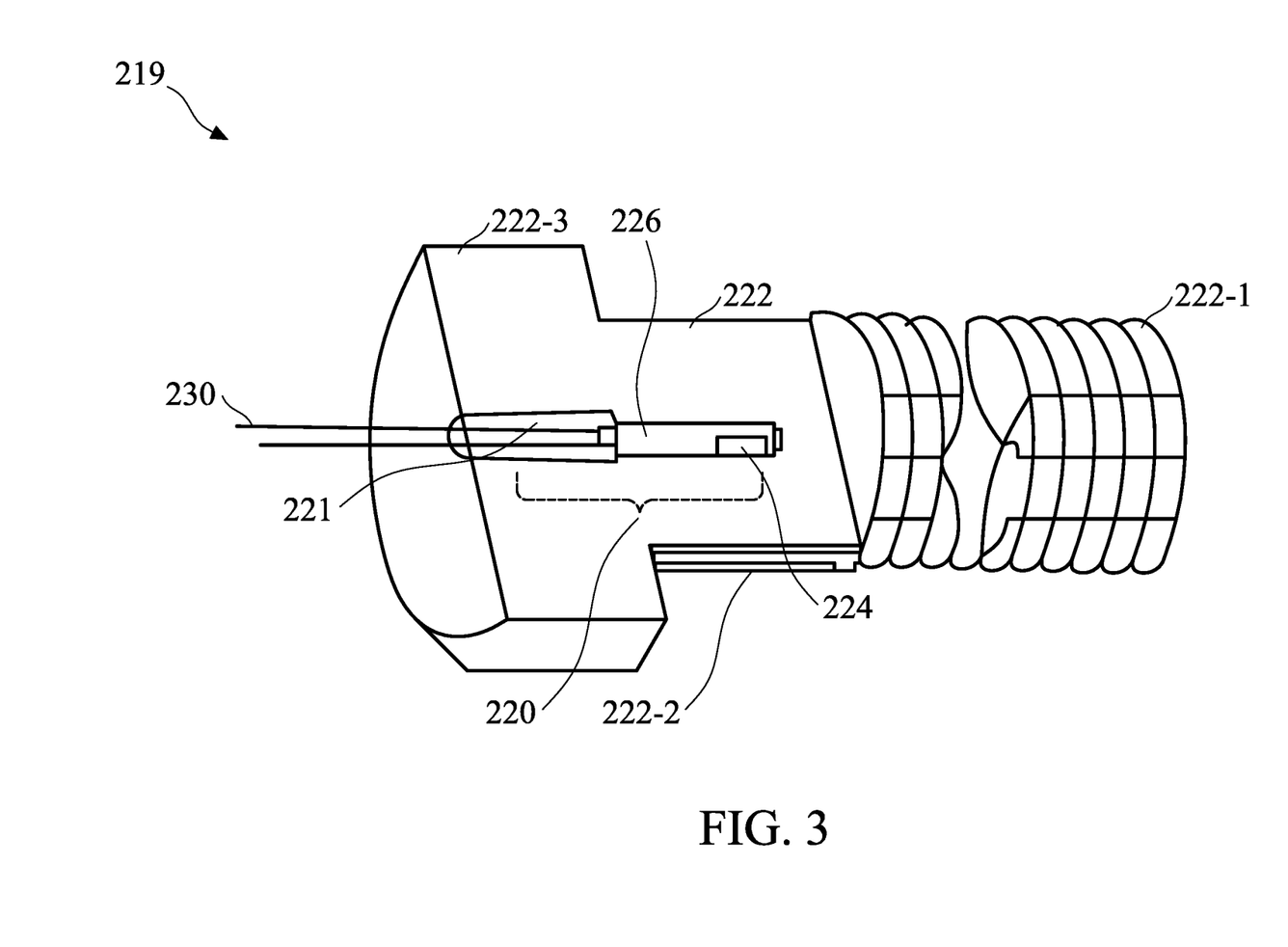
FIG. 3 is a prospective view with a partial cross-section illustrating an exemplary bolt having an exemplary detector embedded therein in the exemplary apparatus of FIG. 2 in accordance with some embodiments.

Referring to FIG. 3, an exemplary detector unit 119 in accordance with some embodiments is illustrated. The exemplary detector unit 119 comprises an exemplary detector 220 and a bolt 222. The exemplary detector 220 is embedded in the bolt 222. The bolt 222 may have screw threads for fastening with the holder 202 or the arm 204. The detector 220 is coupled with both the holder 202 and the arm 204 through the bolt 222. For example, the detector 220 may be embedded inside the bolt 222. In some embodiments, the bolt 222 is horizontally extending through a portion such as a vertical portion 208 of the holder 202 and a portion such as a vertical portion 210 of the arm 204.

As shown in FIG. 3, in some embodiments, the bolt 222 may comprise three segments including a first portion 222-1, a middle second portion 222-2 and a third portion 222-3. The first portion 222-1 has screw threads for fastening with the vertical portion 210 of the arm 204, which also comprises internal threads matching with the screw threads in the first portion 222-1. The third portion 222-3 has a larger dimension compared to the first and the second portion 222-1 and 222-2, and functions as a cap. The detector 220 is housed in the middle portion 222-2. The wires 230 are electrically connected with the detector 220, and extend out from the bolt 222 through a space 221 defined by the bolt 222 in the third portion 222-3 (i.e. the cap portion).

The bolt 222 comprises or is made of a fluoroplastics, such as polyvinylidene fluoride (PVDF) and polytetrafluoroethylene (PTFE), or other suitable engineering plastics. The fluoroplastics or engineering plastics has excellent resistance to chemicals such as acids, bases, and solvents, which are used in the processing tanks. These materials also have good strength, can maintain integrity under stress, and transfer mechanical stress.

Figure 4:
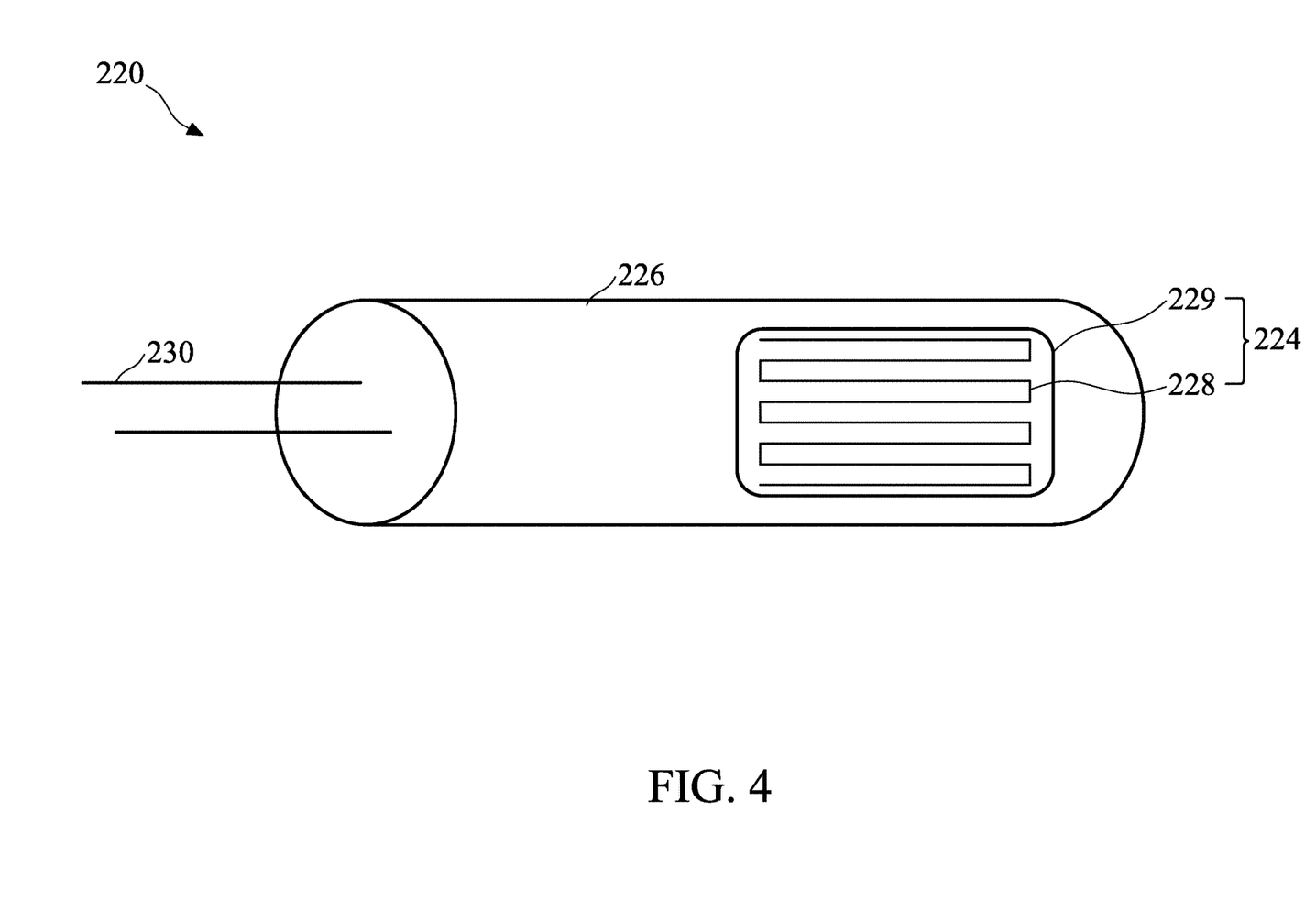
FIG. 4 illustrates an exemplary detector of FIG. 3 in accordance with some embodiments.

Referring to FIG. 4, an exemplary detector 220 is illustrated. The exemplary detector 220 comprises a suitable sensor 224, which is encapsulated with a polymeric material 226 such as an epoxy. Examples of a suitable sensor 224 for the detector 220 (or the detector 220 itself) include, but are not limited to, a strain gauge weight sensor, a piezoelectric sensor or any other suitable sensor.

Figure 5:
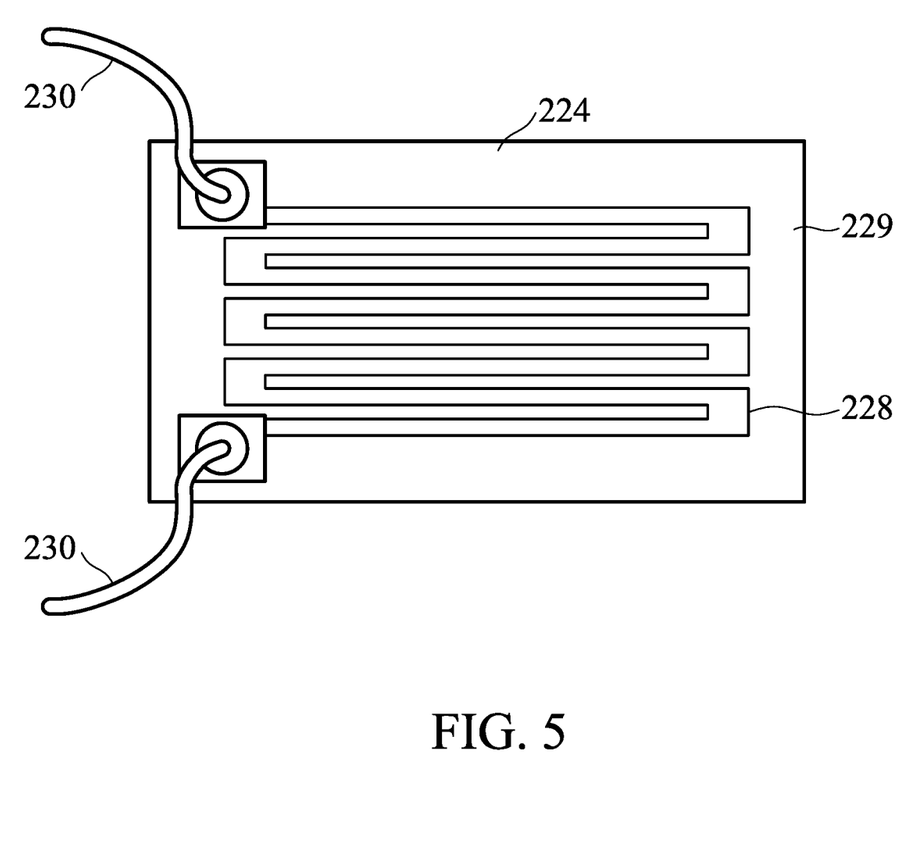
FIG. 5 is an enlarged detail of FIG. 4 showing an exemplary sensor being a strain gauge weight sensor in accordance with some embodiments.

Referring to FIG. 4 and FIG. 5, in some embodiments, the exemplary detector 220 comprises a strain gauge weight sensor. A strain gauge weight sensor may comprise metal wires or foils 228, which is optionally bonded or encapsulated with a polymeric material 229 such as an epoxy or a cyanoacrylate. The metal wires or foils 228 may be made of copper or copper alloy. The orientation of the metal wires or foils 228 in FIGS. 4-5 is for illustration only. The metal wires or foils 228 may be oriented horizontally or vertically inside the bolt 222. The metal wires or foils 228 may be oriented horizontally parallel to an axial direction of the bolt 222. The plane of the metal wires or foils 228 may be also orientated horizontally or vertically. The strain gauge weight sensor is under compression in some embodiments, and may be configured to be in a tensile mode in some other embodiments.

Such a strain gauge weight sensor may have a resistance in a range of from about 30 ohms to about 1,000 ohms, for example, in a range of from about 80 ohms to 200 ohms, or in a range of from about 100 ohms to 150 ohms. The gauge length may be in a range of from 1 cm to 10 cm. Such a strain gauge weight sensor may have active areas of about 2-10 mm$^2$ in size, and may have a gauge factor in the range of from about 1.5 to about 2.5, for example, from about 1.9 to about 2.3. The exemplary detector 220 in the exemplary apparatus 200 may have a sensitivity of about 0.5 g, 1 g, 2 g, 5 g, or 10 g.

As illustrated in FIG. 5, the wires 230 are electrically connected with two ends of the metal wires or foils 228 in the sensor 224. The wires 230 may comprise a metallic material such as copper or aluminum, and a polymeric insulating material coated onto the metallic material. A suitable insulating material may be a polyolefin such as polyethylene, a fluoropolymer such as polytetrafluoroethylene (PTFE).

In some other embodiments, the detector 220 may comprise a piezoelectric sensor. Such a piezoelectric sensor may be placed between a joint between the holder 202 and the arm 204, or a space 260 (FIG. 2) between a horizontal portion 212 of the arm 204 and a top portion of the robot beam 218. In some embodiments, a strain gauge weight sensor as described is used in the exemplary apparatus 200.

In another aspect, the present disclosure also provides a system comprising the component or the exemplary apparatus 200 as described herein. For example, an exemplary system comprises a holder 202 configured to carry one or more semiconductor wafers 203, an arm 204 coupled with the holder 202, and a detector 220 (or a detector unit 119 comprising the detector 220) coupled with either the holder 202 or the arm 204, or both. The detector 220 is configured to measure a change in weight of the one or more semiconductor wafers 203. The system further comprises a bolt 222 having screw threads and horizontally extending through a vertical portion 208 of the holder 202 and a vertical portion 210 of the arm 204. The detector 220 is coupled with both the holder 202 and the arm 204 through the bolt 222. The detector 220 may comprise a strain gauge weight sensor, a piezoelectric sensor or any other suitable sensor. In some embodiments, the detector 220 comprises a strain gauge weight sensor 224 comprising metal wires or foils 228, which is optionally encapsulated with a polymeric material 229. The detector 220 is embedded in a center of the bolt 222 along with an axis of the bolt 222. In some embodiments, the holder 202 is made of quartz, and the bolt 222 is made of a fluoroplastics such as PVDF or PTFE. In some embodiments, the system further comprises a data analyzer 240 (and/or 250), and wires 230 connected with the detector 220 and the data analyzer 240. The data analyzer 240 is configured to analyze signals from the detector and provide an alarm if a wafer is broken or missing.

Figure 6A:
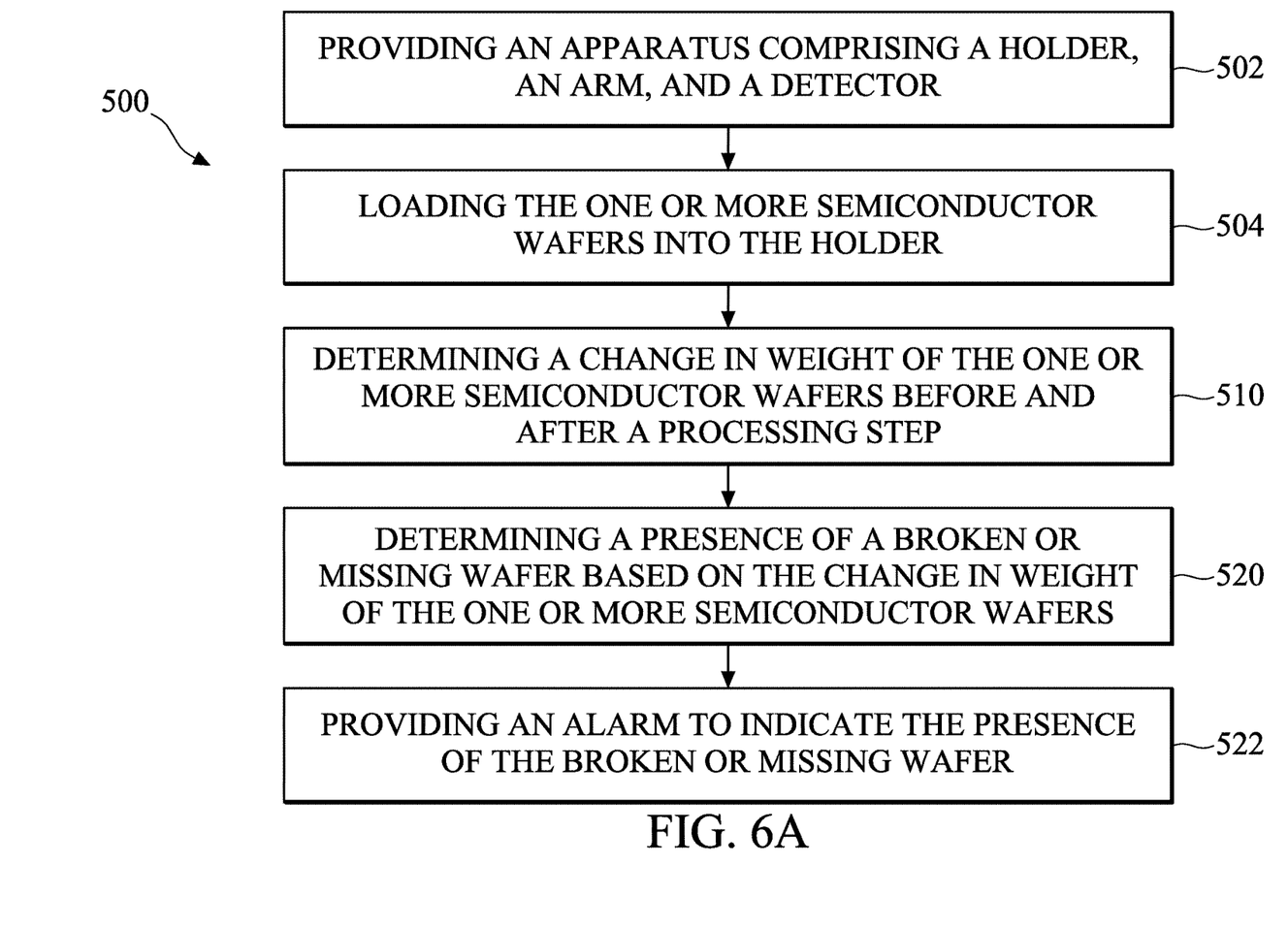
FIG. 6A is a flow chart illustrating an exemplary method in accordance with some embodiments.

The present disclosure also provides a method of using such an apparatus for determining any possible presence of a wafer that is broken, damaged, or missing from a wafer holder. Referring to FIG. 6A, an exemplary method 500 is illustrated in accordance with some embodiments.

At step 502, an apparatus 200 as described is provided. The exemplary apparatus comprises a holder 202 configured to carry one or more semiconductor wafers 203, an arm 204 coupled with the holder 202, and a detector 220 coupled with either the holder 202 or the arm 204. The detector 220 is configured to measure a change in weight of the one or more semiconductor wafers 203.

At step 504, one or more semiconductor wafers 203 are loaded into the holder 202.

Figure 6B:
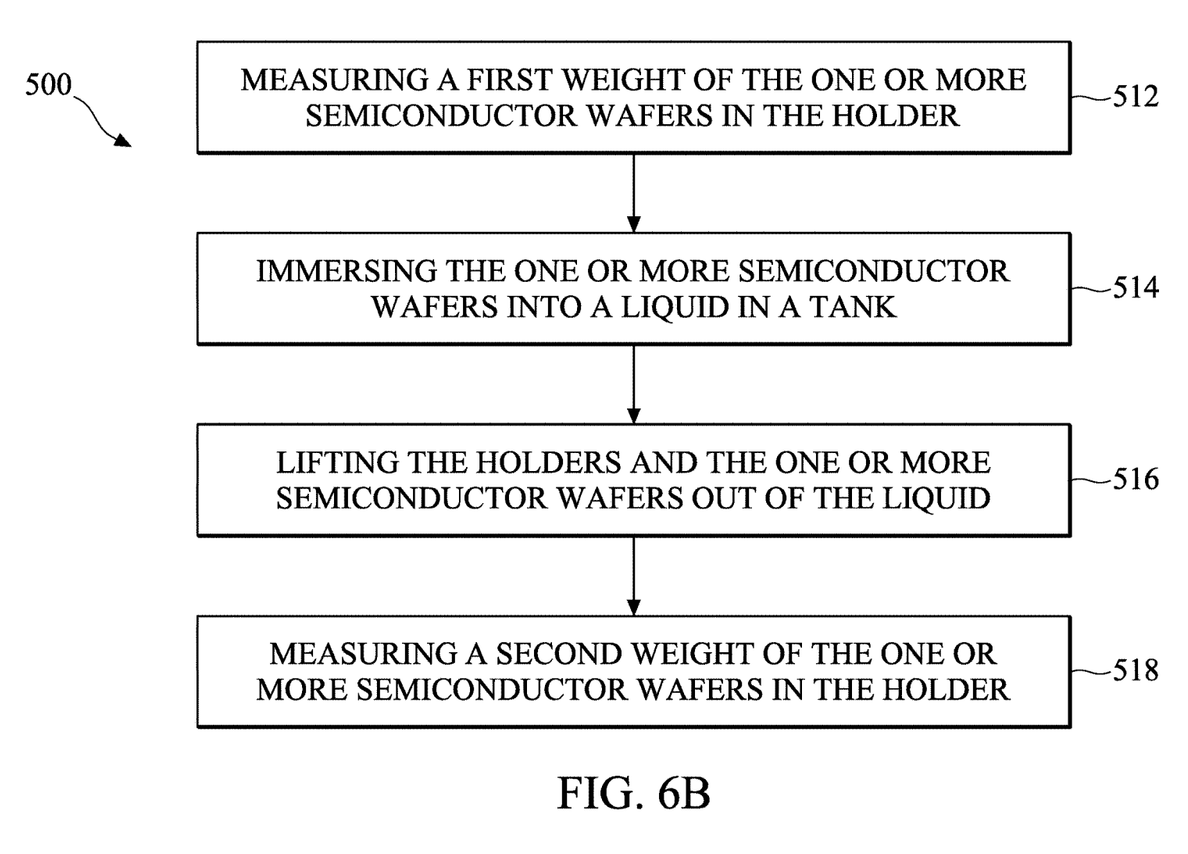
FIG. 6B is a flow chart illustrating an exemplary method for determining a change in weight of the one or more semiconductor wafers in accordance with some embodiments.

At step 506, a change in weight of the one or more semiconductor wafers 203 before and after a processing step is determined. Referring to FIG. 6B, step 506 may include the following steps: steps 512, 514, 516 and 518, in accordance with some embodiments.

At step 512, a first weight of the one or more semiconductor wafers 203 in the holder 202 is measured. The raw data may be a loading force measured by the detector 220.

At step 514, the one or more semiconductor wafers 203 is dipped or immersed into a liquid in a tank. The wafers 203 is dipped or immersed into a liquid in a tank for etching, cleaning or any other chemical treatment.

At step 516, the holder 202 and the one or more semiconductor wafers 203 are lifted out of the liquid. At step 518, a second weight of the one or more semiconductor wafers 203 in the holder 202 is measured. The raw data may be a loading force measured by the detector 220.

Referring back to FIG. 6A, at step 520, an analysis is performed to determine a presence or absence of a broken or missing wafer 205 based on the signals (e.g., load value) from the detector 220 and the resulting change in weight of the one or more semiconductor wafers 203. The loading force is measured by the detector 220 before and after a lifter or holder 202 is immersed into a liquid. The measured loading force before immersing the holder 202 with a plurality of wafers 203 into a liquid is designated as W1. When the holder 202 with the plurality of wafers 203 is lifted out of the liquid to a same position, the measured loading force is designated as W2. The liquid adsorbed on the surface of the holder 202 and the same plurality of wafers 203 is generally in a fixed amount with a weight of $\Delta$. If W2−W1<$\Delta$, the data indicate a presence of a broken, damaged or missing wafer 205 exists. If W2−W1=$\Delta$, there is no breakage, damage or loss to the plurality of wafers 203. If W2−W1>$\Delta$, the data indicate abnormality, for example, other pieces of wafers or debris fallen into the holder 202. However, this abnormality is unlikely to occur.

Alternatively, the change in weight of the one or more semiconductor wafers 203 can be used as the criteria for determining whether there is any broken, damaged or missing wafer. The inherent weight of the lifer or holder 202 is designated as R. The weight of the plurality of wafers before and after the holder 202 is immersed into a liquid is $m_1$ and $m_2$, respectively. So $m_1$=W1−R, and $m_2$=W2−R−$\Delta$. If $m_2-m_1$ is about 0, this indicates that none of the plurality of wafers is damaged, broken or missing. If $m_2-m_1$ is substantially less than 0, a presence of a broken, damaged or missing wafer 205 exists. If $m_2-m_1$ is higher than 0, the data indicate the unlikely abnormality, for example, other pieces of wafers or debris added into the holder 202.

If an etching is used, a normal loss (L) of the materials on the plurality of wafers 203 may be used as for calibration. For example, If $m_2-m_1$ is significantly less than L, a presence of a broken, damaged or missing wafer 205 exists. In some embodiments, such a loss (L) may be negligible.

At step 522, an alarm is provided to indicate the presence of such a wafer 205 if a broken, damaged or missing wafer 205 is detected. A warning may be also given to indicate the unlikely abnormality, for example, other pieces of wafers or debris fall into the holder 202. The alarm and warning may be displayed on the analyzer 240 or 250, and a designated sound alarm or warning may be given. The specific location of the problem (e.g., a specific tank) may be displayed in a diagram on the second analyzer 250.

Figure 7:
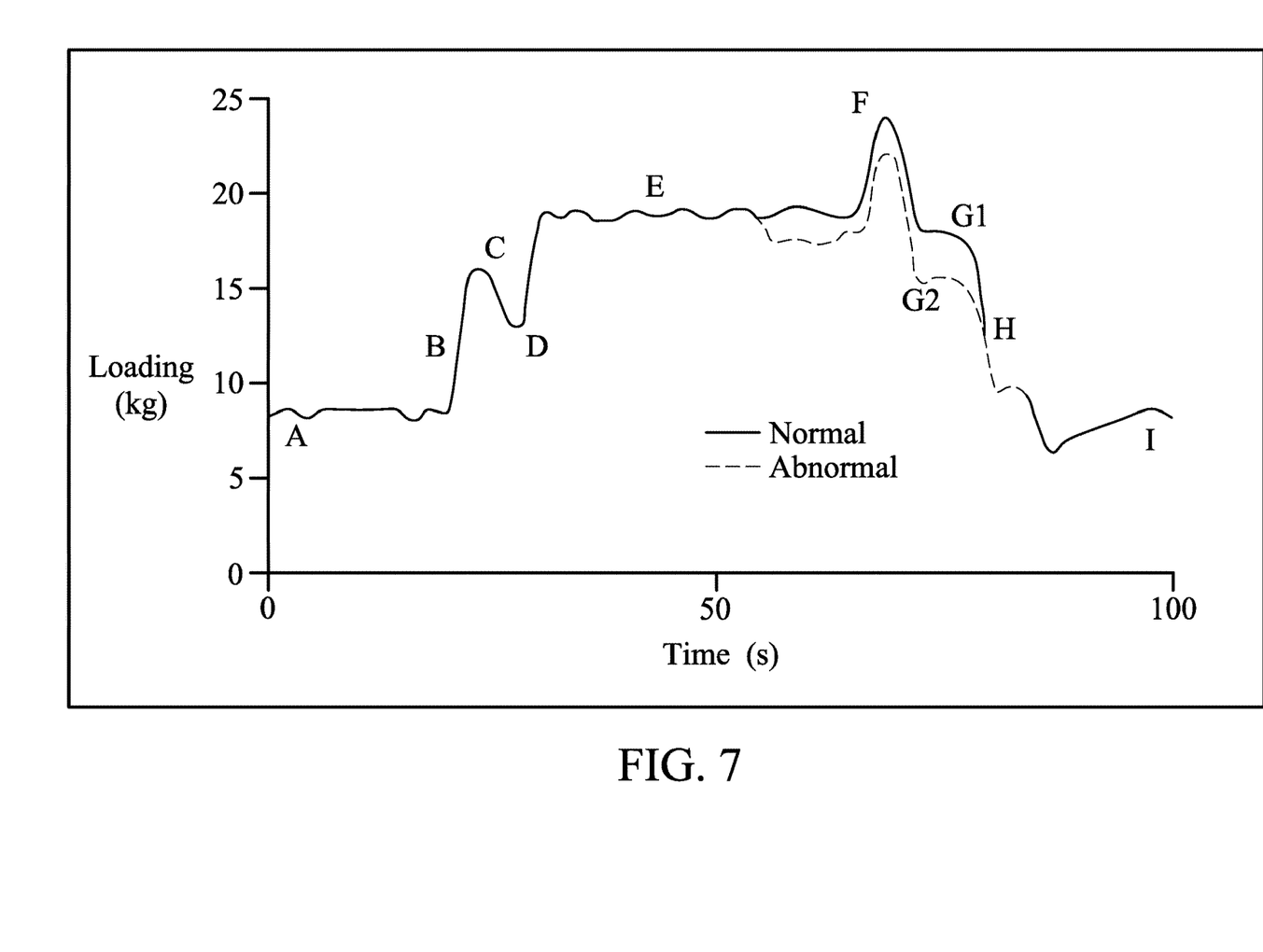
FIG. 7 is an exemplary plot showing the loading values of two examples at different stages of a process in some embodiments.

Table 1 and FIG. 7 show the loading values of two experiments at different stages of a process in some embodiments. Different factors affecting the measured loading force are also shown in Table 1. For example, "+liquid" means that a sample immersed in the liquid may be subject to buoyancy (i.e. −buoyancy). Despite different process steps, the measurements and comparisons are conducted at a same state, for example, before and after the wafers are immersed in a liquid, and then pulled out from the liquid and returns to a same position. Different factors affecting the measured loading force are also programmed into the data analyzer 240 and/or the second analyzer 250.

In these two experiments (Table 1 and FIG. 7), a same number of wafers 203 with a same initial weight were cleaned under the same conditions. The lifter or holder 202 had a weight of 1.2 Kg. The measured loading force (W1) for the holder 202 with a plurality of wafers 203 before immersion was 16 Kg at Point "C" in Table 1 and FIG. 7. When the holder 202 with the plurality of wafers 203 was lifted out of the liquid to the same position, the measured loading force (W2) was 17 Kg in the first experiments, at Point "G1" in Table 1 and FIG. 7. All the wafers were in good conditions, without any damage. The liquid adsorbed on the surface of the holder 202 and the plurality of wafers 203 had a weight ($\Delta$) of 1 Kg. However, in the second experiment, the measured loading force (W2) was 14 Kg at Point "G2" as shown in Table 1 and FIG. 7. The data that W2−W1<$\Delta$ indicated a presence of broken or missing wafers. Based on the weight loss of 3 Kg, the number of the broken or missing wafers could also be estimated. The data in Table 1 and FIG. 7 are shown for illustration only. An alarm is given immediately after such a condition as illustrated in Point "G2" occurs. The broken wafer pieces in the tank is retrieved, and further risk is mitigated.

TABLE 1

| Mark | Description | Factor Affecting Loading | Position | Loading force (Kg) |
|---|---|---|---|---|
| A | Lifter in tank | Robot + liquid | Down | 8 |
| B | Lifter being raised for accepting wafers | Robot + liquid + force | Middle | 10 |
| C | Lifter loaded with wafers | Robot + wafer | Up | 16 |
| D | Lifter being lowered down to a tank | Robot + liquid + wafer − force | Middle | 12 |
| E | Immersion in the tank | Robot + liquid + wafer | Down | 20 |
| F | Lifter being raised up | Robot + liquid + wafer + force | Middle | 23 |
| G1 | Lifter raised out of the tank | Robot + wafer (normal) + surface adsorbed liquid | Up | 17 |
| G2 | Lifter raised out of the tank | Robot + wafer (abnormal) + surface adsorbed liquid | Up | 14 |
| H | Lifter with wafer unloaded, being lowered down to the tank | Robot + liquid − force | Middle | 9 |
| I | Lifer in tank | Robot + liquid | Down | 8 |

The present disclosure provides an apparatus and a method of using such an apparatus for determining any possible presence of a wafer that is broken, damaged, or missing from a wafer holder.

The apparatus comprises a holder configured to carry one or more semiconductor wafers, an arm coupled with the holder, and a detector coupled with either the holder or the arm. The detector configured to measure a change in weight of the one or more semiconductor wafers.

In some embodiments, the holder comprises a L-shaped lifter including a vertical portion and a horizontal portion. The horizontal portion of the L-shaped lifter is configured to carry the one or more semiconductor wafers. The vertical portion is configured to be coupled with the arm. The holder comprises a material selected from the group consisting of quartz, alumina, sapphire, graphite, fused silica, glass, and any combination thereof. In some embodiments, the holder is made of quartz.

In some embodiments, the arm is L-shaped comprising a vertical portion and a horizontal portion. The vertical portion is configured to be coupled with the vertical portion of the holder. The arm comprises metal coated with a protective coating comprising a polymer or ceramic in some embodiments.

The detector comprises a strain gauge weight sensor, a piezoelectric sensor or any other suitable sensor. In some embodiments, the detector is a strain gauge weight sensor comprising metal (such as copper) wires or foils encapsulated with a polymeric material such as an epoxy.

In some embodiments, the apparatus further comprises a bolt having screw threads. The bolt is horizontally extending through a portion such as a vertical portion of the holder and a portion such as a vertical portion of the arm. The bolt comprises a fluoroplastics, such as polyvinylidene fluoride (PVDF) and polytetrafluoroethylene (PTFE), or a suitable engineering plastics. The detector is coupled with both the holder and the arm through the bolt. For example, the detector may be embedded inside the bolt.

In some embodiments, the apparatus further comprises at least a pair of wires connected with the detector. The wires are configured to provide signals for measuring the change in weight of the one or more semiconductor wafers. The apparatus may further comprise a robot beam connected with the arm in some embodiments. The robot beam is movable vertically and horizontally.

In another aspect, the present disclosure also provides a system. The system comprises a holder configured to carry one or more semiconductor wafers, an arm coupled with the holder, and a detector coupled with either the holder or the arm. The detector is configured to measure a change in weight of the one or more semiconductor wafers. The system further comprises a bolt having screw threads and horizontally extending through a vertical portion of the holder and a vertical portion of the arm. The detector is coupled with both the holder and the arm through the bolt. The detector may comprise a strain gauge weight sensor, a piezoelectric sensor or any other suitable sensor. In some embodiments, the detector comprises a strain gauge weight sensor comprising metal wires or foils encapsulated with a polymeric material. The detector is embedded in a center of the bolt along with an axis of the bolt. In some embodiments, the holder is made of quartz, and the bolt is made of a fluoroplastics such as PVDF or PTFE.

In some embodiments, the system further comprises a data analyzer, and wires connected with the detector and the data analyzer. The data analyzer is configured to analyze signals from the detector and provide an alarm if a wafer is broken or missing.

In another aspect, the present disclosure provides a method for detecting whether there is any wafer broken, damaged or missing. The method comprises a step of providing an apparatus comprising a holder configured to carry one or more semiconductor wafers, an arm coupled with the holder, and a detector coupled with either the holder or the arm. The detector is configured to measure a change in weight of the one or more semiconductor wafers. The method further comprises steps of loading the one or more semiconductor wafers into the holder, and determining a change in weight of the one or more semiconductor wafers before and after a processing step.

In some embodiments, the step of determining a change in weight of the one or more semiconductor wafers comprises steps of: measuring a first weight of the one or more semiconductor wafers in the holder, immersing the one or more semiconductor wafers into a liquid in a tank, lifting the holder and the one or more semiconductor wafers out of the liquid, and measuring a second weight of the one or more semiconductor wafers in the holder.

The method may further comprise determining a presence of a broken or missing wafer based on the change in weight of the one or more semiconductor wafers, and providing an alarm to indicate the presence of such a wafer if a broken, damaged or missing wafer is detected.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, or any combination of these mediums, wherein, when the computer program code is loaded into and executed by a computer, the computer becomes an apparatus for practicing the method. The methods may also be at least partially embodied in the form of a computer into which computer program code is loaded and/or executed, such that, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
    a holder configured to carry one or more semiconductor wafers;
    an arm coupled with the holder; and
    a detector disposed inside either the holder or the arm or disposed inside a joint between the holder and the arm, the detector configured to measure a change in weight of the one or more semiconductor wafers,
    wherein the detector comprises a strain gauge weight sensor or a piezoelectric sensor.

2. The apparatus of claim 1, wherein the holder comprises a L-shaped lifter including a vertical portion and a horizontal portion, the horizontal portion of the L-shaped lifter configured to carry the one or more semiconductor wafers.

3. The apparatus of claim 1, wherein the holder comprises a material selected from the group consisting of quartz, alumina, sapphire, graphite, fused silica, glass, and any combination thereof.

4. The apparatus of claim 1, wherein the arm is L-shaped, and comprises metal coated with a protective coating comprising a polymer or ceramic.

5. The apparatus of claim 1, wherein the detector is a strain gauge weight sensor comprising metal wires or foils encapsulated with a polymeric material.

6. The apparatus of claim 1, further comprising a bolt having screw threads and horizontally extending through a vertical portion of the holder and a vertical portion of the arm, wherein the detector is coupled with both the holder and the arm through the bolt.

7. The apparatus of claim 6, wherein the detector is embedded inside the bolt.

8. The apparatus of claim 6, wherein the bolt comprises a fluoroplastics.

9. The apparatus of claim 1, further comprising at least a pair of wires connected with the detector and configured to provide signals for measuring the change in weight of the one or more semiconductor wafers.

10. The apparatus of claim 1, further comprises a robot beam connected with the arm, and the robot beam is movable vertically.

11. A method for using the apparatus of claim 1, comprising:
    providing the apparatus of claim 1;
    loading the one or more semiconductor wafers into the holder; and
    determining a change in weight of the one or more semiconductor wafers before and after a processing step.

12. The method of claim 11, wherein the step of determining a change in weight of the one or more semiconductor wafers comprises:
    measuring a first weight of the one or more semiconductor wafers in the holder;
    immersing the one or more semiconductor wafers into a liquid in a tank;
    lifting the holder and the one or more semiconductor wafers out of the liquid; and
    measuring a second weight of the one or more semiconductor wafers in the holder.

13. The method of claim 11, further comprising:
    determining a presence of a broken or missing wafer based on the change in weight of the one or more semiconductor wafers; and
    providing an alarm to indicate the presence of the broken or missing wafer.

14. A system comprising:
    a holder configured to carry one or more semiconductor wafers;
    an arm coupled with the holder;
    a robot beam connected with the arm, and
    a detector disposed inside either the holder or the arm or disposed inside a joint between the holder and the arm, the detector configured to measure a change in weight of the one or more semiconductor wafers,
    wherein the detector comprises a strain gauge weight sensor or a piezoelectric sensor.

15. The system of claim 14, further comprising a bolt having screw threads and horizontally extending through a vertical portion of the holder and a vertical portion of the arm, wherein the detector is coupled with both the holder and the arm through the bolt.

16. The system of claim 15, wherein the detector comprises a strain gauge weight sensor comprising metal wires or foils encapsulated with a polymeric material.

17. The system of claim 15, wherein the detector is embedded in a center of the bolt along with an axis of the bolt.

18. The system of claim 15, wherein the holder is made of quartz, and the bolt is made of a fluoroplastics.

19. The system of claim 14, further comprises a data analyzer, and wires connected with the detector and the data analyzer, wherein the data analyzer is configured to analyze signals from the detector and provide an alarm if a wafer is broken or missing.

20. An apparatus comprising:
    a holder configured to carry one or more semiconductor wafers;
    an arm coupled with the holder; and
    a detector disposed inside a joint between the holder and the arm, the detector configured to measure a change in weight of the one or more semiconductor wafers,
    wherein the detector comprises a strain gauge weight sensor or a piezoelectric sensor, and the detector is disposed inside a bolt extending a portion of the holder and a portion of the arm.

* * * * *